United States Patent
Kakizaki et al.

(10) Patent No.: US 8,841,641 B2
(45) Date of Patent: Sep. 23, 2014

(54) EXTREME ULTRAVIOLET LIGHT SOURCE APPARATUS

(71) Applicant: Gigaphoton Inc., Oyama (JP)

(72) Inventors: Kouji Kakizaki, Hiratsuka (JP); Shinji Nagai, Hiratsuka (JP); Tatsuya Yanagida, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/903,811

(22) Filed: May 28, 2013

(65) Prior Publication Data
US 2013/0256567 A1  Oct. 3, 2013

Related U.S. Application Data

(63) Continuation of application No. 13/293,914, filed on Nov. 10, 2011, now Pat. No. 8,530,870, which is a continuation of application No. PCT/JP2010/060376, filed on Jun. 18, 2010.

(30) Foreign Application Priority Data

Jun. 19, 2009 (JP) ................................ 2009-146253
Jun. 17, 2010 (JP) ................................ 2010-138303

(51) Int. Cl.
*G01N 21/33* (2006.01)
*G21K 5/02* (2006.01)
*H05H 1/00* (2006.01)

(52) U.S. Cl.
USPC ....... 250/504 R; 250/365; 250/431; 422/121; 422/186.3; 134/1.1

(58) Field of Classification Search
CPC .... H05G 2/008; H05G 2/005; G03F 7/70033; G21K 1/10; G21K 5/02; G02B 19/0095; G01N 21/33; H05H 1/00
USPC ........... 250/504 R, 365, 431; 422/121, 186.3; 134/1.1
See application file for complete search history.

(56) References Cited

U.S. PATENT DOCUMENTS 4,886,969 A   12/1989   Knauer
5,991,360 A   11/1999   Matsui et al.
(Continued)

FOREIGN PATENT DOCUMENTS

JP   01-265443   10/1989
JP   08-017371   1/1996
(Continued)

OTHER PUBLICATIONS

Japanese Office Action with partial translation issued in Japanese Application No. 2010-138303 dated Jun. 11, 2013.

*Primary Examiner* — Nikita Wells
(74) *Attorney, Agent, or Firm* — McDermott Will & Emery LLP

(57) ABSTRACT

An extreme ultraviolet light source apparatus in which a target material is irradiated with a laser beam and turned into plasma and extreme ultraviolet light is emitted from the plasma may include: a chamber in which the extreme ultraviolet light is generated; an electromagnetic field generation unit for generating at least one of an electric field and a magnetic field inside the chamber; and a cleaning unit for charging and separating debris adhered to an optical element inside the chamber.

16 Claims, 12 Drawing Sheets

(56) References Cited

U.S. PATENT DOCUMENTS

| | | |
|---|---|---|
| 6,987,279 B2 | 1/2006 | Hoshino et al. |
| 7,087,914 B2 | 8/2006 | Akins et al. |
| 7,164,144 B2 | 1/2007 | Partlo et al. |
| 7,196,342 B2 | 3/2007 | Ershov et al. |
| 7,217,940 B2 | 5/2007 | Partlo et al. |
| 7,271,401 B2 | 9/2007 | Imai et al. |
| 7,355,191 B2 | 4/2008 | Bykanov et al. |
| 7,642,533 B2 | 1/2010 | Partlo et al. |
| 8,003,963 B2 * | 8/2011 | Nagai et al. ............... 250/504 R |
| 8,256,441 B2 * | 9/2012 | Moriya et al. ................ 134/186 |
| 8,530,870 B2 * | 9/2013 | Kakizaki et al. .......... 250/504 R |
| 2006/0091109 A1 | 5/2006 | Partlo et al. |
| 2006/0097203 A1 | 5/2006 | Bykanov et al. |
| 2006/0186356 A1 | 8/2006 | Imai et al. |
| 2008/0099699 A1 | 5/2008 | Yabuta et al. |
| 2008/0212045 A1 | 9/2008 | Bader |
| 2008/0237498 A1 | 10/2008 | MacFarlane |
| 2008/0237501 A1 | 10/2008 | Hosokai et al. |
| 2008/0267816 A1 | 10/2008 | Ueno et al. |
| 2009/0224181 A1 | 9/2009 | Abe et al. |
| 2010/0025231 A1 | 2/2010 | Moriya et al. |
| 2010/0176313 A1 | 7/2010 | Melnychuk et al. |
| 2010/0192973 A1 | 8/2010 | Ueno et al. |
| 2013/0319466 A1 * | 12/2013 | Mizoguchi et al. ............. 134/18 |

FOREIGN PATENT DOCUMENTS

| | | |
|---|---|---|
| JP | 09-260245 | 10/1997 |
| JP | 10-223395 | 8/1998 |
| JP | 2008-277481 A | 11/2008 |
| JP | 2008-277522 A | 11/2008 |
| JP | 2010-146956 A | 7/2010 |

* cited by examiner

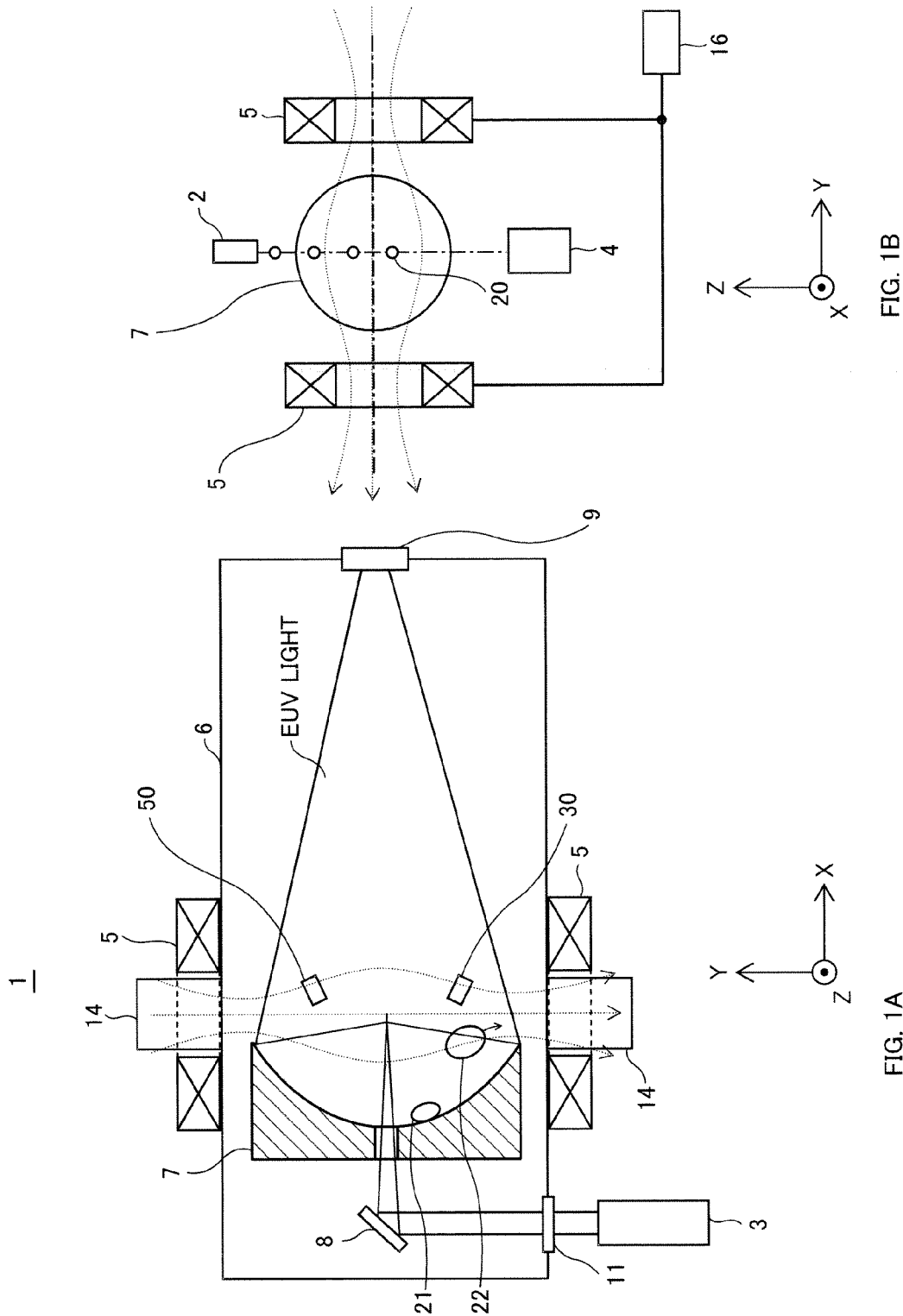

IONIZED ETCHANT GAS FLOW

EXTREME ULTRAVIOLET LIGHT SOURCE APPARATUS

CROSS-REFERENCE TO RELATED APPLICATIONS

The application is a continuation of PCT/JP2010/060376 filed Jun. 18, 2010, which claims priority of Japanese Patent Application No. 2009-146253, filed Jun. 19, 2009, and Japanese Patent Application No. 2010-138303, filed Jun. 17, 2010, the entire contents of which are hereby incorporated by reference.

BACKGROUND

1. Technical Field

This disclosure relates to an extreme ultraviolet light source apparatus.

2. Related Art

Photolithography processes have been continuously improving for semiconductor device fabrication. Extreme ultraviolet (EUV) light at a wavelength of approximately 13 nm is useful in the photolithography processes to form extremely small features (e.g., 32 nm or less features) in, for example, semiconductor wafers.

Three types of system for generating EUV light have been well known. The systems include an LPP (Laser Produced Plasma) type system in which plasma generated by irradiating a target material with a laser beam is used, a DPP (Discharge Produced Plasma) type system in which plasma generated by electric discharge is used, and an SR (Synchrotron Radiation) type system in which orbital radiation is used.

SUMMARY

An extreme ultraviolet light source apparatus according to one aspect of this disclosure, in which a target material is irradiated with a laser beam and turned into plasma and extreme ultraviolet light is emitted from the plasma, may include: a chamber in which the extreme ultraviolet light is generated; an electromagnetic field generation unit for generating at least one of an electric field and a magnetic field inside the chamber; and a cleaning unit for charging and separating debris adhered to an optical element inside the chamber.

BRIEF DESCRIPTION OF THE DRAWINGS

FIG. 1A is a sectional view schematically illustrating the configuration of an EUV light source apparatus according to one embodiment of this disclosure; and FIG. 1B is a front view of the apparatus shown in FIG. 1A.

DESCRIPTION OF PREFERRED EMBODIMENTS

Figure 2B:
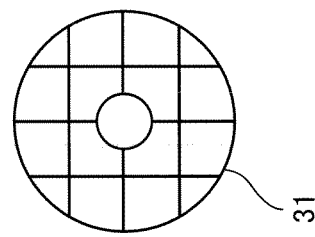
FIG. 2B is a front view of a grid electrode.

Hereinafter, selected embodiments of this disclosure will be described in detail with reference to the drawings. Configurations and operations of the embodiments described below are merely illustrative and do not limit the scope of this disclosure. Further, the configurations described in the embodiments below are not all essential in this disclosure. It should be noted that like elements are referenced by like reference numerals, and duplicate descriptions thereof will be omitted.

FIG. 1A is a sectional view schematically illustrating the configuration of an EUV light source apparatus according to one embodiment of this disclosure, and FIG. 1B is a front view of the EUV light source apparatus. In FIG. 1A and in other sectional views, an EUV collector mirror 7 is illustrated in a sectional view.

In an EUV light source apparatus 1, a laser produced plasma (LPP) method is employed in which EUV light is generated by irradiating a target material with a laser beam, which excites the target material. As shown in FIG. 1, the EUV light source apparatus 1 may include a target supply unit 2, a plasma generation laser unit 3, a target collection unit 4, an electromagnetic field generation unit 5, a chamber 6, the EUV collector mirror 7, a focusing optical system 8, a charged debris collection unit 14, a debris charging unit 30, and a debris separation unit 50. The debris charging unit 30 and the debris separation unit 50 may constitute a cleaning unit of this disclosure.

The target supply unit 2 may be configured to successively supply a target material 20, such as tin (Sn) or lithium (Li), used to generate the EUV light into the chamber 6. The target material 20 which has been supplied into the chamber 6 but has not been irradiated with the laser beam and no longer needed may be collected into the target collection unit 4.

The target material 20 may be in any of solid, liquid, and gaseous states. Further, the target supply unit 2 may supply the target material 20 into the chamber 6 in any of the known modes, such as a continuous jet (target jet), a liquid droplet (droplet), and so forth. For example, when molten tin (Sn) is used as the target material 20, the target supply unit 2 may be provided with a heater for heating tin, a gas cylinder for supplying a high-purity Ar gas for pressurizing molten tin, a mass flow controller, a target nozzle, and so forth. Alternatively, a vibration device such as a piezoelectric element may be provided to the target nozzle of the target supply unit 2 to generate droplets.

The plasma generation laser unit 3 may be a master-oscillator power-amplifier type laser apparatus configured to generate a driver laser beam used to excite the target material 20. A laser beam, such as a $CO_2$ laser beam, generated by the plasma generation laser unit 3 may be focused on a trajectory of the target material 20 in the chamber 6 by the focusing optical system 8 which includes at least one lens and/or at least one mirror. When the target material 20 is irradiated with a laser beam at a wavelength corresponding to an energy level width of an atom constituting the target material 20, the target material 20 is excited to be ionized, whereby plasma is generated and the EUV light is emitted from the plasma.

The electromagnetic field generation unit 5 is a device for generating an electric field or a magnetic field inside the chamber 6. The electromagnetic field generation unit 5 may be a device for generating a magnetic field, which may include a coil winding, a cooling mechanism for the coil winding, a power supply 16 for supplying power thereto, and so forth. When a current is supplied to the coil winding from the power supply 16, a desirable magnetic field may be generated inside the chamber 6. When an ion (debris) having a directional component that differs from the direction of the magnetic field passes through a region where the magnetic field lies, the ion may be subjected to the Lorentz force acting in a direction perpendicular to the direction of the magnetic field generated by the electromagnetic field generation unit 5 and may be trapped in the magnetic field. The ion trapped in the magnetic field may be collected into the charged debris collection unit 14. Alternatively, the electromagnetic field generation unit 5 may generate an electric field instead of the magnetic field, and the ion may be trapped in the electric field and collected into the charged debris collection unit 14.

The chamber 6 may be a vacuum chamber in which the EUV light is generated. The chamber 6 may be provided with an exposure apparatus connection port 9 through which the EUV light generated in the chamber 6 may be outputted to an external processing apparatus such as an exposure apparatus, and a window 11 through which the laser beam generated by the plasma generation laser unit 3 passes into the chamber 6.

The EUV collector mirror 7 may be provided inside the chamber 6. The EUV collector mirror 7 may be coated with a multilayer film which reflects the EUV light at a predetermined wavelength (for example, wavelength of 13.5 nm) with high reflectance, and the reflective surface thereof may be configured to focus the EUV light at a predetermined location. The EUV collector mirror 7, for example, may be spheroidal in shape, and may be disposed such that one of the foci of the spheroidal reflective surface coincides with a plasma generation site (light emitting point).

The target material 20 supplied into the chamber 6 may be irradiated with the laser beam generated by the plasma generation laser unit 3. Thus, the target material 20 may be turned into plasma, and rays at various wavelengths may be emitted from the plasma. Of these rays of light, light at a predetermined wavelength (for example, a wavelength of 13.5 nm) may be collected and reflected with high reflectance by the EUV collector mirror 7, and may be outputted through the exposure apparatus connection port 9 into a processing apparatus such as an exposure apparatus provided outside the chamber 6.

Ionic particles and neutral particles may be emitted from the plasma which emits the EUV light. These particles (debris) may adhere, as adhered debris 21, to surfaces of various optical elements, such as the EUV collector mirror 7, inside the chamber 6, and may cause the reflectance at the surfaces of the optical elements to decrease.

The debris charging unit 30 may be configured to cause the debris adhered to the optical element inside the chamber 6 to become charged. A specific configuration for causing the debris to become charged will be described later.

The debris separation unit 50 may be configured to cause the debris adhered to the optical element inside the chamber 6 to be separated from the optical element. The configuration for causing the debris to be separated from the optical element, for example, may be such that the optical element is heated and irradiated with ultraviolet light, whereby adhesion between the optical element and the debris is broken and the debris is separated from the optical element. Alternatively, the configuration may be such that an etchant gas (hydrogen, halogen, halide, and so forth) is introduced into the chamber 6, and the etchant gas reacts with the debris, whereby the debris may be gasified and the gasified debris may be separated from the optical element.

The EUV light source apparatus 1 of this embodiment may include the debris charging unit 30 and the debris separation unit 50. Accordingly, with the EUV light source apparatus 1, it is possible to cause the adhered debris 21 adhered to the optical element in the chamber 6 to become charged and to thereby be separated from the optical element. Alternatively, the adhered debris 21 may be separated from the optical element and then made to become charged, whereby the adhered debris 21 may be re-floated as charged debris 22 in the chamber 6. Thus, with the EUV light source apparatus 1, the charged debris 22 may be trapped in the electric field or the magnetic field generated by the electromagnetic field generation unit 5 and collected into the charged debris collection unit 14. With this, it can be expected that the debris is prevented from re-adhering to the optical element and that a cleaning speed is increased.

As for temporal sequence between charging of the debris by the debris charging unit 30 and separation of the debris by the debris separation unit 50, either one may precede the other, or they may be concurrent with each other. Further, the debris charging unit 30 and the debris separation unit 50 may be implemented as a single component. When the adhered debris 21 is first charged and thereafter is separated from the optical element, the debris charging unit 30 may correspond to an example of an adhered debris charging unit of this disclosure, and the debris separation unit 50 may correspond to an example of a charged debris separation unit of this disclosure. When the adhered debris 21 is first separated from the optical element and thereafter is charged, the debris separation unit 50 may correspond to an example of an adhered debris separation unit of this disclosure, and the debris charging unit 30 may correspond to an example of a separated debris charging unit of this disclosure.

Here, an example in which the plasma generation laser unit 3 is included in the EUV light source apparatus 1 has been illustrated; however, this disclosure is not limited thereto, and the plasma generation laser unit 3 maybe configured as a laser apparatus separate from the EUV light source apparatus 1 configured so as to output a laser beam to the EUV light source apparatus 1. In addition, an exposure apparatus has been illustrated as an example of the processing apparatus configured to perform processing using the EUV light; however, without being limited thereto, the processing apparatus may be a reticle inspection apparatus (mask inspection apparatus) and so forth.

Figure 2A:
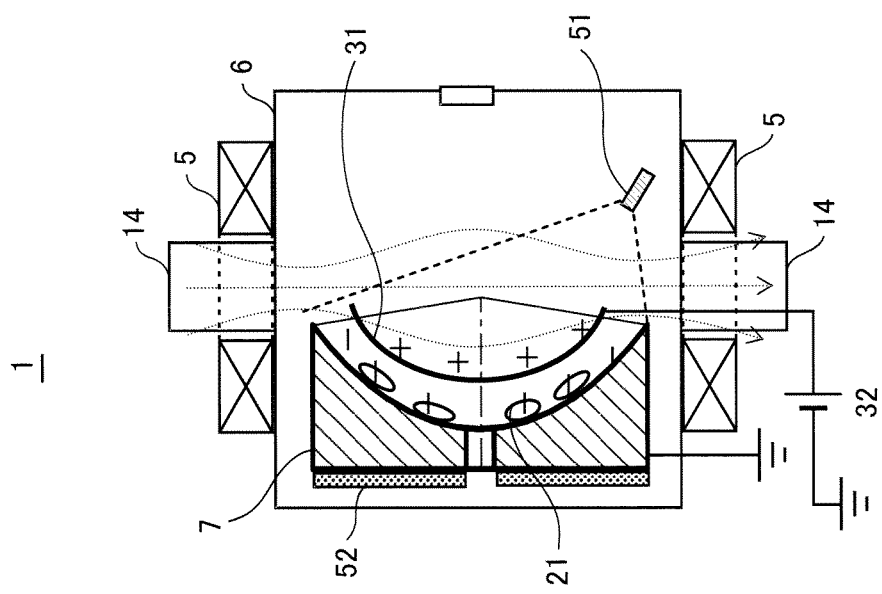
FIG. 2A is a sectional view schematically illustrating the configuration in which adhered debris is charged by electrostatic induction and the charged debris is separated from an optical element according to a first modification.

Hereinafter, modifications of this embodiment will be described. FIG. 2A is a sectional view illustrating a first modification in which the adhered debris is charged by electrostatic induction and the charged debris is separated from the optical element, and FIG. 2B is a front view of a grid electrode.

In the EUV light source apparatus 1 according to the first modification, a grid electrode 31 may be disposed along a reflective surface of the EUV collector mirror 7 with a constant space therebetween. The grid electrode 31 may correspond to an example of the adhered debris charging unit of this disclosure. The grid electrode 31 is formed of a wire or the like in a mesh-like form so as not to block the EUV light, and is connected to a direct current power supply unit 32. The EUV collector mirror 7 facing the grid electrode 31 is connected to the ground potential.

In the EUV light source apparatus 1 according to the first modification, an ultraviolet light source 51 for irradiating the reflective surface of the EUV collector mirror 7 with ultraviolet light may be disposed in the chamber 6. Further, a heater 52 for heating the EUV collector mirror 7 may be disposed on a rear surface of the EUV collector mirror 7. The ultraviolet light source 51 and the heater 52 may correspond to examples of the charged debris separation unit of this disclosure.

In the above configuration, in the EUV light source apparatus 1 according to the first modification, constant voltage may be applied to the grid electrode 31 by the power supply unit 32. For example, when the grid electrode 31 is set to a positive potential, the EUV collector mirror 7 may be negatively charged due to the electrostatic induction. On the other hand, when the grid electrode 31 is set to a negative potential, the EUV collector mirror 7 may be positively charged due to the electrostatic induction. With this, the adhered debris 21 adhered to the EUV collector mirror 7 may become charged to have the same polarity as the EUV collector mirror 7.

Here, the EUV collector mirror 7 may be heated by the heater 52 and the adhered debris 21 adhered to the EUV collector mirror 7 may be irradiated with the ultraviolet light by the ultraviolet light source 51. Then, constituent atoms of the adhered debris 21 may be injected with energy, and the adhered debris 21 injected with sufficient energy may break adhesion with the EUV collector mirror 7 and be separated from the surface of the EUV collector mirror 7. Of the separated debris, a certain amount, while being charged to have the same polarity as the EUV collector mirror 7, may be subjected to repulsive force due to the Coulomb force from the surface of the EUV collector mirror 7 to fly out into the space inside the chamber 6. Of the flown-out debris, a majority of the debris which remains charged will be subjected to the Lorentz force by the magnetic field generated by the electromagnetic field generation unit 5 to thereby be trapped in the magnetic field and collected into the charged debris collection unit 14.

A configuration with which the debris is separated from the optical element, such as the EUV collector mirror 7, is not limited to the use of the ultraviolet light source 51 and the heater 52, and may be light-irradiation etching with a laser beam other than the ultraviolet light, an x-ray, or EUV light, reactive dry etching with an etchant gas, or physical sputtering by noble gas ion bombardment.

Figure 3:
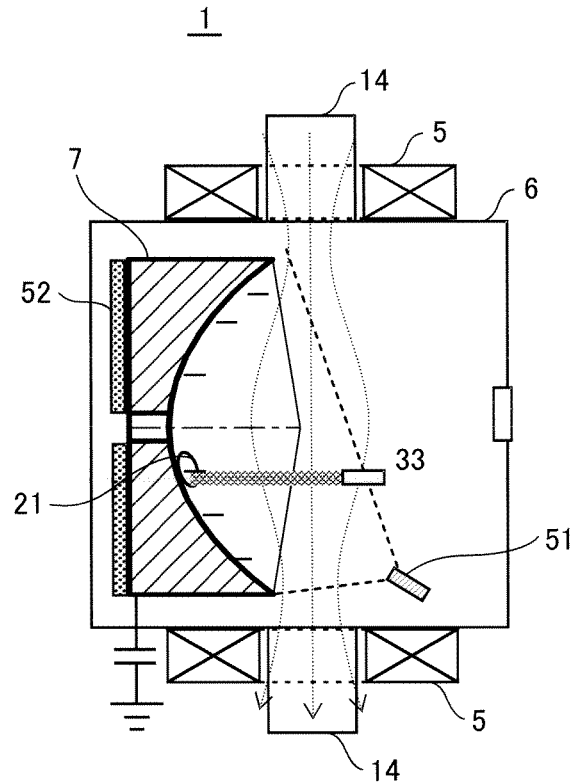
FIG. 3 is a sectional view illustrating a second modification in which adhered debris is charged by being supplied with charged particles and the charged debris is separated from an optical element.

FIG. 3 is a sectional view illustrating a second modification in which the adhered debris is charged by charged particles, and the charged debris is separated from the optical element.

In the EUV light source apparatus 1 according to the second modification, an electron gun 33 for supplying the reflective surface of the EUV collector mirror 7 with electrons may be disposed in the chamber 6. The electron gun 33 may correspond to an example of a charged particle supply unit of this disclosure. The EUV collector mirror 7 is insulated from the ground potential so that the direct current component does not flow into the ground potential. The configuration for separating the debris from the optical element, such as the EUV collector mirror 7, may be the same as that of the first modification.

In the above configuration, with the EUV light source apparatus 1 according to the second modification, the reflective surface of the EUV collector mirror 7 may be supplied with electrons (charged particles) by the electron gun 33, and thus the EUV collector mirror 7 and the adhered debris 21 can be negatively charged. The electrons may be supplied to the adhered debris 21 directly by the electron gun 33.

As in the first modification, the charged debris may be separated from the optical element, such as the EUV collector mirror 7, using the ultraviolet light source 51, the heater 52, and so forth. With this, the debris will be trapped in the magnetic field generated by the electromagnetic field generation unit 5 and collected into the charged debris collection unit 14.

Figure 4:
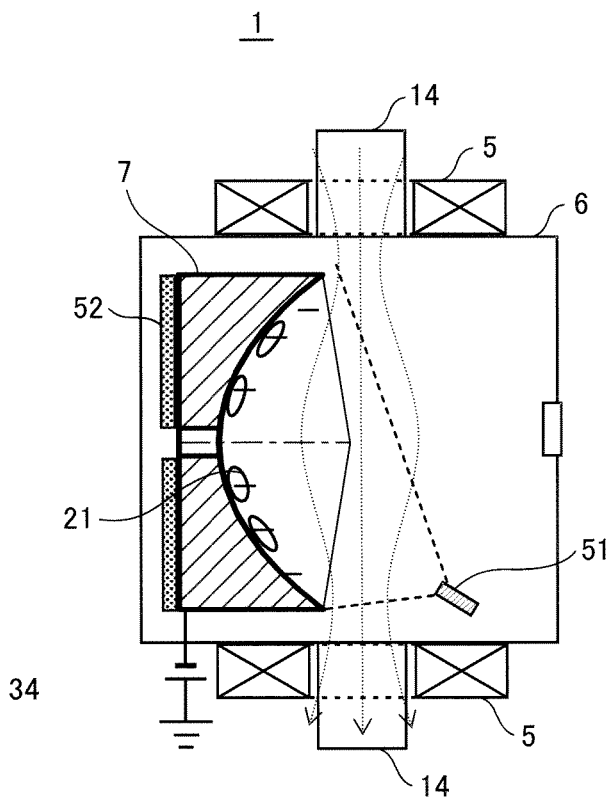
FIG. 4 is a sectional view illustrating a third modification in which adhered debris is charged by being connected to direct current power supply and the charged debris is separated from an optical element.

FIG. 4 is a sectional view illustrating a third modification in which the adhered debris is charged by being connected to direct current power supply and the charged debris is separated from the optical element.

In the EUV light source apparatus 1 according to the third modification, the EUV collector mirror 7 may be connected to a direct current power supply unit 34. The configuration for separating the debris from the optical element, such as the EUV collector mirror 7, may be the same as that of the first modification.

In the above configuration, in the EUV light source apparatus 1 according to the third modification, constant voltage maybe applied to the EUV collector mirror 7 by the power supply unit 34. As a result, the EUV collector mirror 7 and the adhered debris 21 may be charged. FIG. 4 shows an example where a negative potential is applied, but a positive potential may be applied instead.

As in the first modification, the charged debris may be separated from the optical element, such as the EUV collector mirror 7, using the ultraviolet light source 51, the heater 52, and so forth. With this, the debris will be trapped in the magnetic field generated by the electromagnetic field generation unit 5 and collected into the charged debris collection unit 14.

Figure 5:
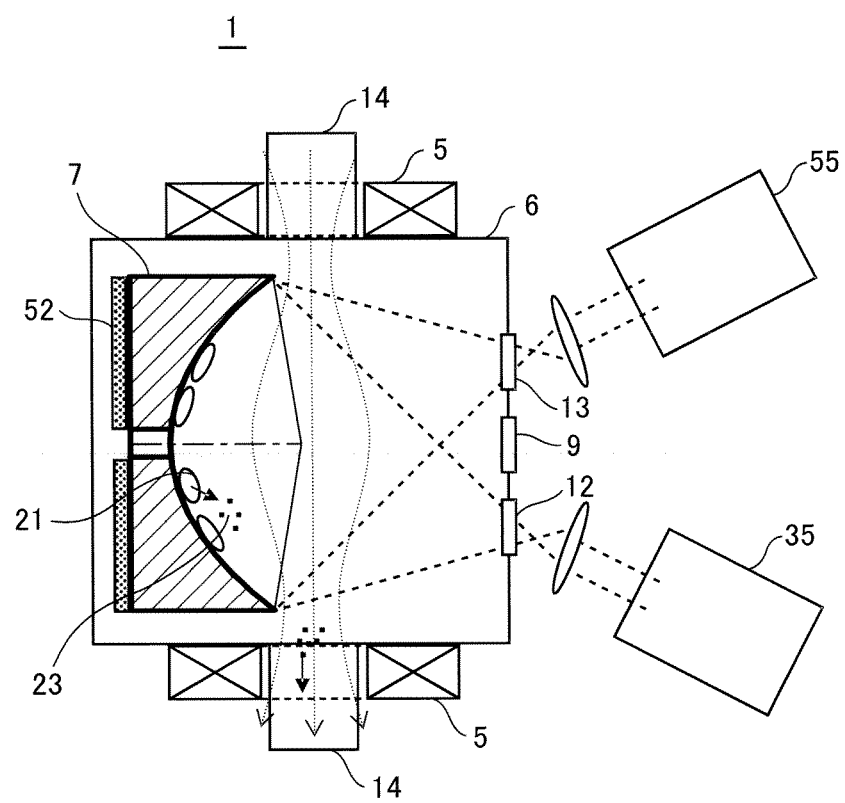
FIG. 5 is a sectional view illustrating a fourth modification in which adhered debris is charged by an ionization laser and the charged debris is separated from an optical element.

FIG. 5 is a sectional view illustrating a fourth modification in which the adhered debris is charged by an ionization laser beam and the charged debris is separated from the optical element.

In the EUV light source apparatus 1 according to the fourth modification, an ionization laser unit 35 may be disposed outside the chamber 6. A laser beam from the ionization laser unit 35 may be introduced into the chamber 6 through a window 12, which is separate from the exposure apparatus connection port 9, and the adhered debris 21 adhered to the EUV collector mirror 7 may be irradiated therewith. The laser beam from the ionization laser unit 35 may contain a wavelength component of one or more wavelengths which are tuned to resonance absorption wavelengths of the constituent atoms of the debris, and the debris maybe irradiated with the laser beam to thereby be charged.

Further, in the EUV light source apparatus 1 according to the fourth modification, a cleaning light source unit 55 may be disposed outside the chamber 6. The light from the cleaning light source unit 55 may be introduced into the chamber 6 through a window 13, which is separate from the exposure apparatus connection port 9, and the reflective surface of the EUV collector mirror 7 may be irradiated therewith.

In the above configuration, the adhered debris 21 may be irradiated with the ionization beam from the ionization laser unit 35, whereby the constituent atoms of the debris 21 can undergo resonance absorption and be efficiently excited to a higher level. When the adhered debris 21 is irradiated substantially simultaneously with a laser beam tuned to the resonance absorption wavelengths of one or more wavelengths corresponding to energy required for the debris to transition between levels, the constituent atoms of the adhered debris 21 may be excited sequentially between resonant levels, and ionized at a level higher than the ionization level, to thereby be charged. For example, the wavelength component of one or more wavelengths tuned to the resonance absorption wavelengths of tin (Sn) may include any of (a) a three-wavelength component containing a wavelength of 286.42 nm, a wavelength of 811.62 nm, and a wavelength of 823.67 nm, (b) a three-wavelength component containing a wavelength of 286.4 nm, a wavelength of 617.2 nm, and a wavelength in a range from 416 nm to 418 nm, (c) a wavelength component containing a wavelength of 286.4 nm, a wavelength of 615 nm, and a wavelength in a range from 614 nm to 618 nm, (d) a wavelength component containing a wavelength in a range from 270 nm to 318 nm, and (e) a wavelength component containing a wavelength of 456.5 nm. Alternatively, the adhered debris 21 may also be ionized by being irradiated with a laser beam having photon energy of 7.34 eV, which is ionization energy of a tin atom, or above (corresponding to a wavelength component of 169.2 nm or below).

Since the cleaning light source unit 55 may irradiate the adhered debris 21 with ultraviolet light, a laser beam, an x-ray, EUV light, and so forth, for cleaning, the constituent atoms of the adhered debris 21 may be injected with energy. Then, the charged adhered debris 21 may break adhesion with the EUV collector mirror 7 and be separated from the surface of the EUV collector mirror 7. At this time, the EUV collector mirror 7 may be heated by the heater 52 in order to facilitate separation of the adhered debris 21 from the EUV collector mirror 7. The separated debris ($Sn^+$ ion 23) maybe trapped in the magnetic field generated by the electromagnetic field generation unit 5 and collected into the charged debris collection unit 14.

The debris may be separated from the optical element, such as the EUV collector mirror 7, by reactive dry etching with an etchant gas, or by physical sputtering by noble gas ion bombardment.

Figure 6B:
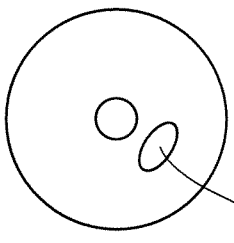
FIG. 6B shows a monitor image.
Figure 6A:
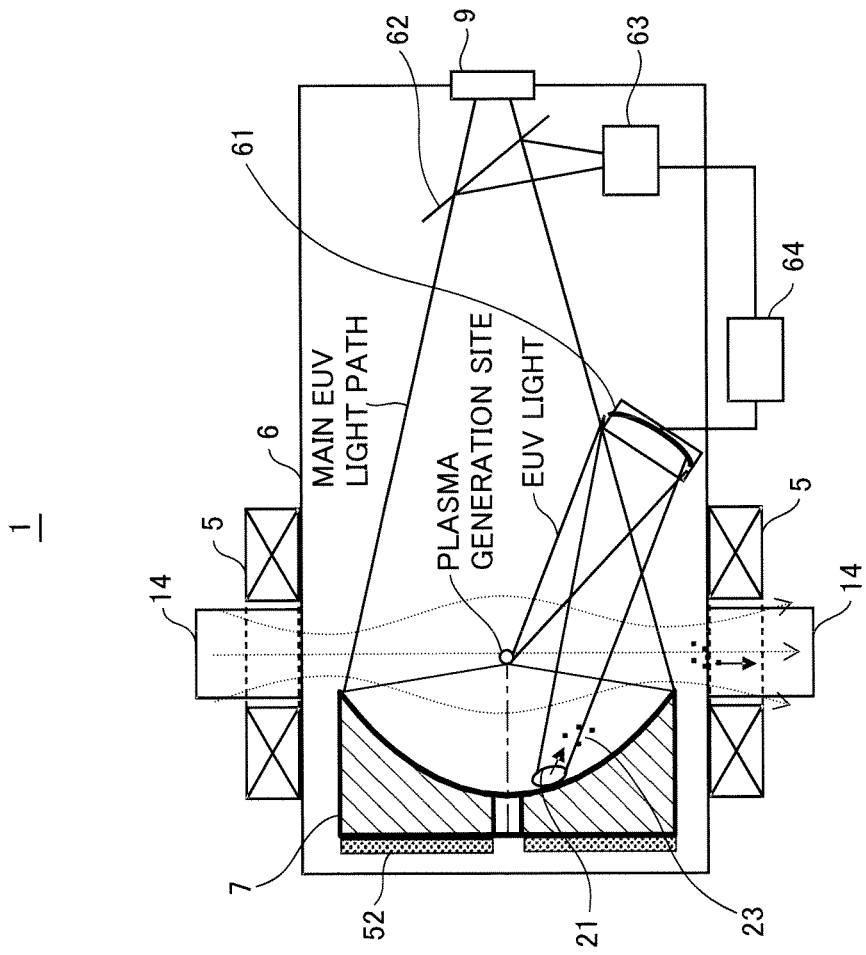
FIG. 6A is a sectional view illustrating a fifth modification in which adhered debris is charged by EUV light and the charged debris is separated from an optical element.

FIG. 6A is a sectional view illustrating a fifth modification in which the adhered debris is charged by EUV light and the charged debris is separated from the optical element; and FIG. 6B shows a monitor image.

In the EUV light source apparatus 1 according to the fifth modification, an EUV light irradiation mirror 61 for irradiating the adhered debris with the EUV light generated in the chamber 6 may be disposed in the chamber 6. The EUV light irradiation mirror 61 may be disposed at a position offset from a main EUV light path along which the EUV light generated at a plasma generation site located at a focus of the EUV collector mirror 7 and reflected at the reflective surface of the EUV collector mirror 7 may travel to the exposure apparatus connection port 9.

On the main EUV light path, a fluorescent screen 62 which emits visible light in accordance with the intensity of the EUV light may be disposed. The fluorescent screen 62 is inclined at 45 degrees with respect to the axis of the EUV light. Further, a CCD camera 63 capable of capturing an image of intensity distribution of the visible light emitted at the fluorescent screen 62 may be disposed at a position offset from the main EUV light path. Connected to the CCD camera 63 may be a posture control unit 64 for controlling the posture of the EUV light irradiation mirror 61. The posture control unit 64 may include an image processing device with which a portion with lower luminescence intensity may be identified based on the image captured by the CCD camera 63, and a multi-axis stage for controlling the posture of the EUV light irradiation mirror 61 such that the EUV light from the plasma generation site is reflected and focused on the portion with the lower luminescence intensity by the EUV light irradiation mirror 61.

In the above configuration, in the EUV light source apparatus 1 according to the fifth modification, the EUV light irradiation mirror 61 may reflect the EUV light emitted at the plasma generation site and focus the EUV light at the adhered debris 21 on the EUV collector mirror 7. In this way, the constituent atoms of the debris may be supplied with ionization energy and energy with which the debris can break the adhesion with the EUV collector mirror 7. Further, the focused EUV light may ionize and charge the adhered debris 21, and cause the adhered debris 21 to be separated from the EUV collector mirror 7. At this time, the EUV collector mirror 7 may be heated by the heater 52 in order to facilitate separation of the adhered debris 21 from the EUV collector mirror 7. The debris ($Sn^+$ ion 23) charged and separated from the EUV collector mirror 7 may be trapped in the magnetic field generated by the electromagnetic field generation unit 5 and collected into the charged debris collection unit 14.

A location of the adhered debris 21 adhered to the EUV collector mirror 7 may correspond to a portion with lower luminescence intensity on the fluorescent screen 62 captured by the CCD camera 63. Accordingly, the posture control unit 64 can identify the portion with the lower luminescence intensity based on the image captured by the CCD camera 63. With this, the posture control unit 64 may control the posture of the EUV light irradiation mirror 61 such that the EUV light may be focused on the portion corresponding to the portion with the lower luminescence intensity by the EUV light irradiation mirror 61, whereby the EUV light can be focused on the adhered debris 21.

Figure 7:
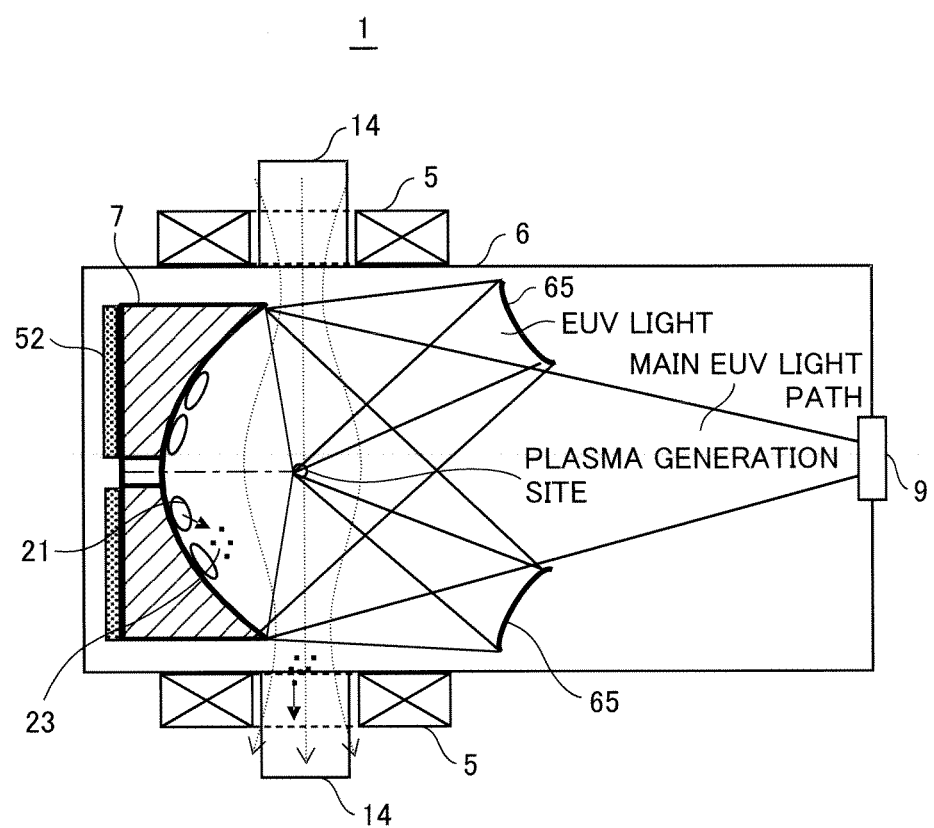
FIG. 7 is a sectional view illustrating a sixth modification in which adhered debris is charged by EUV light and the charged debris is separated from an optical element.

FIG. 7 is a sectional view illustrating a sixth modification in which the adhered debris is charged by the EUV light and the charged debris is separated from the optical element.

In the EUV light source apparatus 1 according to the sixth modification, an EUV light irradiation mirror 65 can irradiate the entire reflective surface of the EUV collector mirror 7 with the EUV light emitted at the plasma generation site located at a focus of the EUV collector mirror 7. Since the EUV light irradiation mirror 65 has an annular shape so as to surround the main EUV light path, the EUV light irradiation mirror 65 can irradiate a large area of the reflective surface of the EUV collector mirror 7 with the EUV light and supply energy required to ionize and separate a large portion of the adhered debris 21. It is to be noted that the fluorescent screen 62 can be movable so that it can be retreated from the main EUV light path when the EUV light is outputted to the exposure apparatus or the like.

According to the sixth modification, it is not necessary to identify the location of the adhered debris and focus the light thereon. Accordingly, the fluorescent screen 62, the CCD camera 63, and posture control unit 64 as in the fifth modification do not have to be provided. Other configurations may be the same as those of the fifth modification.

Figure 8:
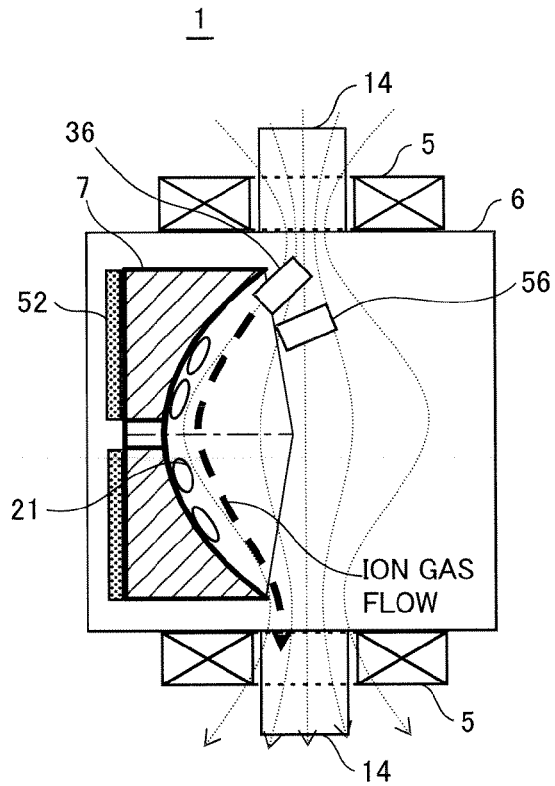
FIG. 8 is a sectional view illustrating a seventh modification in which adhered debris is separated from an optical element and the separated debris is charged by being supplied with charged particles.

FIG. 8 is a sectional view illustrating a seventh modification in which the adhered debris is separated from the optical element and the separated debris is charged by being supplied with charged particles.

In the EUV light source apparatus 1 according to the seventh modification, an etchant gas port 56 may be disposed in the chamber 6 for causing the adhered debris 21 to be separated from the optical element by an etchant gas (hydrogen, halogen, halide, and so forth). Further, the heater 52 for heating the EUV collector mirror 7 may be provided on the rear surface of the EUV collector mirror 7. The etchant gas port 56 and the heater 52 may correspond to examples of the adhered debris separation unit of this disclosure.

In the EUV light source apparatus 1 according to the seventh modification, an ion gas port 36 may be disposed in the chamber 6 for supplying the debris separated from the EUV collector mirror 7 with ions to thereby cause the debris to become charged. The ion gas port 36 may correspond to an example of the charged particle supply unit and the separated debris charging unit of this disclosure.

In the above configuration, in the EUV light source apparatus 1 according to the seventh modification, the EUV collector mirror 7 may be heated by the heater 52, and the etchant gas may be introduced along the reflective surface of the EUV collector mirror 7 by the etchant gas port 56. With this, in the EUV light source apparatus 1 according to the seventh modification, Sn debris, for example, may be separated from the EUV collector mirror 7 as a gasified substance ($SnH_4$, $SnBr_4$, or the like).

Here, the separated debris may be supplied with an ion gas from the ion gas port 36, and the ion and the gasified substance of the debris separated from the reflective surface of the EUV collector mirror 7 may collide with each other and react, whereby the debris may become charged. For example, when an anion ($Br^-$) is supplied from the ion gas port 36, $SnBr_3^-$ and $Br_2$ may be generated by the reaction between $SnBr_4$ and $Br^-$. When a cation ($H^+$) is supplied from the ion gas port 36, $SnBr_4^+$ and H may be generated by the reaction between $SnBr_4$ and $H^+$. In this way, since the gasified debris may become charged, the debris may be trapped in the magnetic field generated by the electromagnetic field generation unit 5 and collected into the charged debris collection unit 14.

Figure 9:
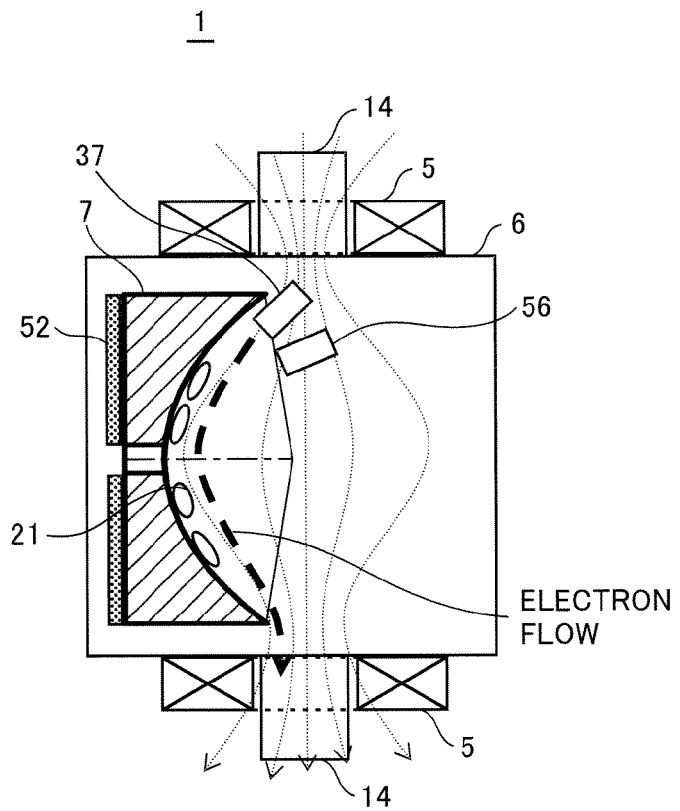
FIG. 9 is a sectional view illustrating an eighth modification in which adhered debris is separated from an optical element and the separated debris is charged by being supplied with charged particles.

FIG. 9 is a sectional view illustrating an eighth modification in which the adhered debris is separated from the optical element and the separated debris is charged by being supplied with charged particles.

In the EUV light source apparatus 1 according to the eighth modification, an electron gun 37 may be disposed in the chamber 6 in place of the ion gas port 36 in the seventh modification. The electron gun 37 may correspond to an example of the charged particle supply unit and the separated debris charging unit of this disclosure. Other configurations may be the same as those in the seventh modification.

In the above configuration, in the EUV light source apparatus 1 according to the eighth modification, the adhered debris 21 may be separated from the EUV collector mirror 7 using the heater 52 and the etchant gas port 56. Further, in the EUV light source apparatus 1, the separated debris may be supplied with a low-energy electron of, for example, 1 eV or below from the electron gun 37. With this, the electron may be attached to the gasified substance of the debris separated from the reflective surface of the EUV collector mirror 7, whereby the debris may become charged. In this way, when the gasified debris becomes charged, the debris may be trapped in the magnetic field generated by the electromagnetic field generation unit 5 and collected into the charged debris collection unit 14.

Figure 10:
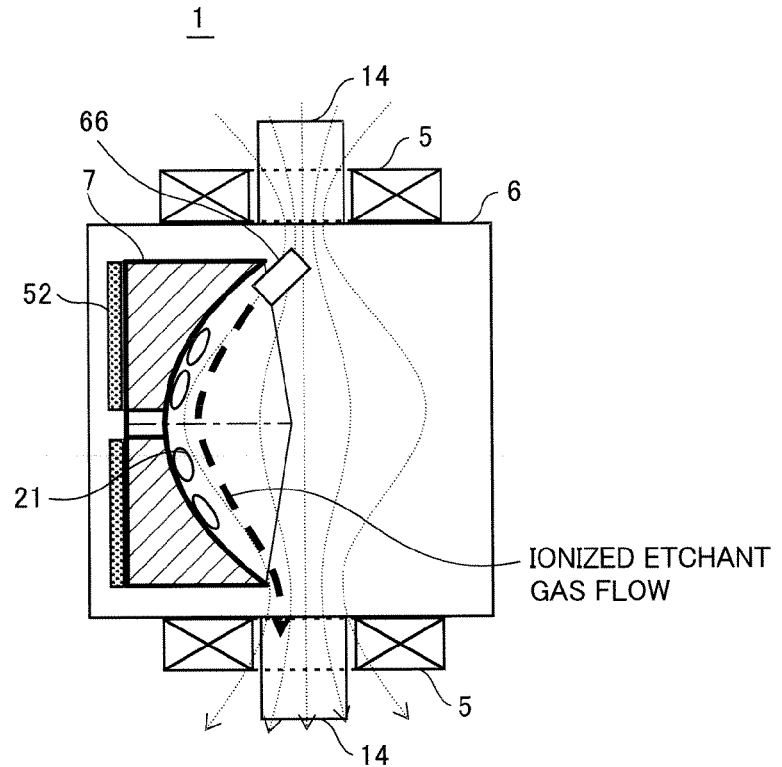
FIG. 10 is a sectional view illustrating a ninth modification in which adhered debris is separated and charged by being supplied with charged particles.

FIG. 10 is a sectional view illustrating a ninth modification in which the adhered debris is separated and charged by being supplied with charged particles.

In the EUV light source apparatus 1 according to the ninth modification, an ionized etchant gas port 66 may be disposed in the chamber 6 in place of the etchant gas port and the ion gas port of the seventh modification. The ionized etchant gas port 66 may correspond to an example of an ionized etchant gas supply unit of this disclosure. Other configurations may be the same as those of the seventh modification.

In the above configuration, in the EUV light source apparatus 1 according to the ninth modification, the EUV collector mirror 7 may be heated by the heater 52, and an ionized etchant gas, such as a halide ion, may be introduced along the reflective surface of the EUV collector mirror 7 by the ionized etchant gas port 66. With this, in the EUV light source apparatus 1 according to the ninth modification, the adhered debris may be separated from the EUV collector mirror 7 and be charged as well. In this way, the debris separated from the EUV collector mirror 7 and charged may be trapped in the magnetic field generated by the electromagnetic field generation unit 5 and collected into the charged debris collection unit 14.

Figure 11:
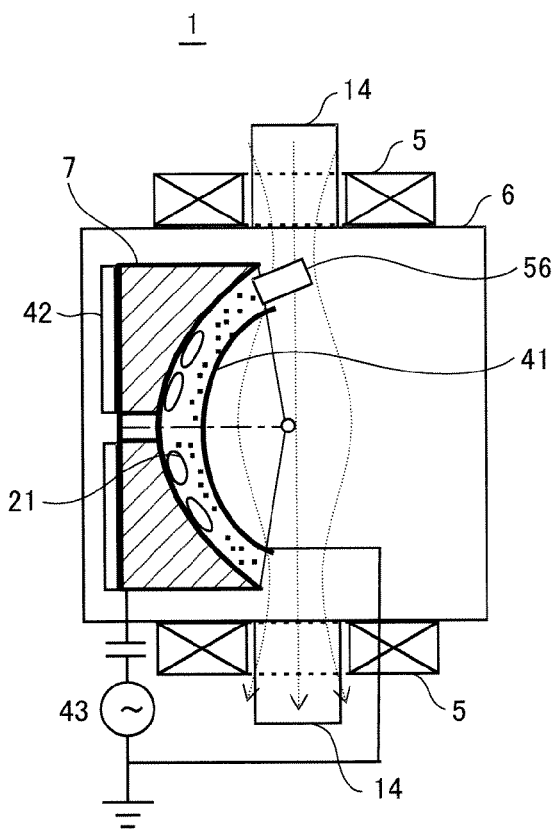
FIG. 11 is a sectional view illustrating a tenth modification in which adhered debris is separated from an optical element and the separated debris is charged by being supplied with plasma.

FIG. 11 is a sectional view illustrating a tenth modification in which the adhered debris is separated from the optical element and the separated debris is charged by being supplied with an etchant gas or the like that is turned into plasma.

In the EUV light source apparatus 1 according to the tenth modification, the etchant gas port 56 may be disposed in the chamber 6 for supplying the adhered debris 21 with an etchant gas (hydrogen, halogen, halide, or the like) to thereby cause the adhered debris 21 to be separated from the optical element. The etchant gas port 56 may correspond to an example of the adhered debris separation unit of this disclosure.

Further, in the EUV light source apparatus 1 according to the tenth modification, a grid electrode 41 may be disposed along the reflective surface of the EUV collector mirror 7 with a constant space therebetween. The grid electrode 41 is formed of a wire or the like in a mesh-like form so that not all of the EUV light is blocked. The grid electrode 41 may be connected to the ground potential. A mirror-side electrode 42 may be provided on the rear surface of the EUV collector mirror 7 which faces the grid electrode 41. The mirror-side electrode 42 maybe connected to RF power supply 43. The grid electrode 41, the mirror-side electrode 42, and the RF power supply 43 may correspond to examples of the plasma generation unit and the separated debris charging unit of this disclosure.

In the above configuration, in the EUV light source apparatus 1 according to the tenth modification, the etchant gas may be introduced along the reflective surface of the EUV collector mirror 7 by the etchant gas port 56. With this, in the EUV light source apparatus 1 according to the tenth modification, the Sn debris, for example, may be separated from the EUV collector mirror 7 as a gasified substance ($SnH_4$, $SnBr_4$, or the like).

Here, when the RF power supply 43 applies high frequency voltage between the grid electrode 41 and the mirror-side electrode 42, capacitively coupled plasma may be generated between the electrodes. The plasma may be one in which the etchant gas is turned into plasma, or one in which a noble gas, such as argon (Ar) or the like, which has been separately introduced is turned into plasma. Further, without being limited to the capacitively coupled plasma, inductively coupled plasma or helicon wave plasma may be used.

The gasified substance containing a constituent atom of the debris separated from the EUV collector mirror 7 may collide with various particles in the plasma and be dissociated to thereby be ionized. In this way, when the gasified debris becomes charged, the debris may be trapped in the magnetic field generated by the electromagnetic field generation unit 5 and collected into the charged debris collection unit 14.

Figure 12:
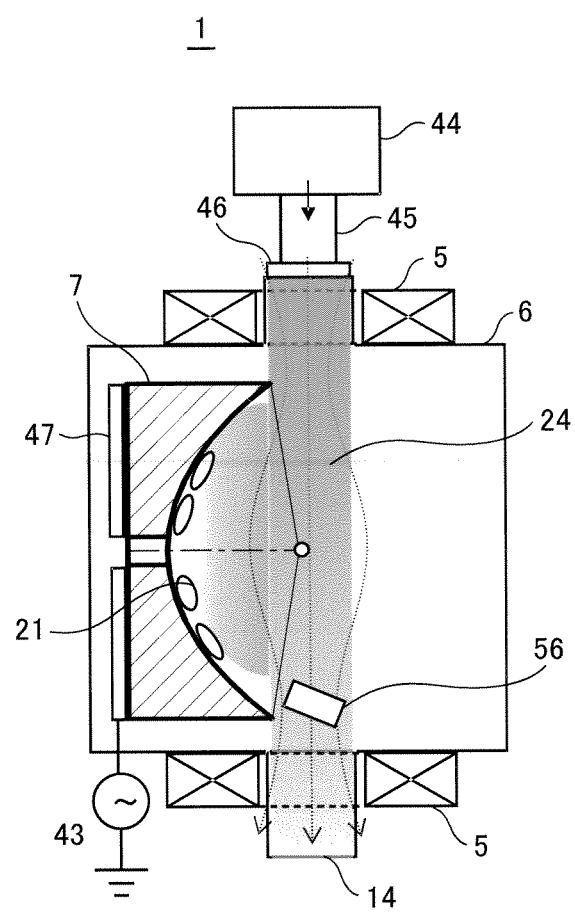
FIG. 12 is a sectional view illustrating an eleventh modification in which adhered debris is separated from an optical element and the separated debris is charged by being supplied with plasma.

FIG. 12 is a sectional view illustrating an eleventh modification in which the adhered debris is separated from the optical element and the separated debris is charged by being supplied with an etchant gas or the like that is turned into plasma.

In the EUV light source apparatus 1 according to the eleventh modification, a microwave oscillator 44 and a waveguide 45 may be disposed outside the chamber 6. Microwave generated by the microwave oscillator 44 maybe introduced into the magnetic field in the chamber 6 through the waveguide 45 and a window 46 of the chamber 6. An electrode 47 may be provided on the rear surface of the EUV collector mirror 7, and the electrode 47 may be connected to the RF power supply 43. The RF power supply 43, the microwave oscillator 44, and the electrode 47 may correspond to examples of the plasma generation unit and the separated debris charging unit of this disclosure. The configuration for causing the adhered debris 21 to be separated from the EUV collector mirror 7 may be the same as that of the tenth modification.

With the above configuration, in the EUV light source apparatus 1 according to the eleventh modification, the etchant gas may be introduced along the reflective surface of the EUV collector mirror 7 by the etchant gas port 56. With this, in the EUV light source apparatus 1 according to the eleventh modification, the Sn debris, for example, may be separated from the EUV collector mirror 7 as a gasified substance ($SnH_4$, $SnBr_4$, or the like).

Here, the microwave in accordance with the magnetic field intensity of the electromagnetic field generation unit 5 may be generated by the microwave oscillator 44, and the microwave may be introduced into the magnetic field in the chamber 6. Further, when bias voltage is applied by the RF power source 43, low-pressure, high-density ECR plasma 24 may be generated in the chamber 6. It is to be noted that without being limited to the ECR plasma 24, surface wave plasma may be generated by introducing the microwave from the vicinity of the EUV collector mirror 7.

The gasified substance containing the constituent atom of the debris separated from the EUV collector mirror 7 may collide with the charged particles in the plasma and be dissociated to thereby be ionized. In this way, when the gasified debris becomes charged, the debris may be trapped in the magnetic field generated by the electromagnetic field generation unit 5 and collected in the charged debris collection unit 14.

Figure 13:
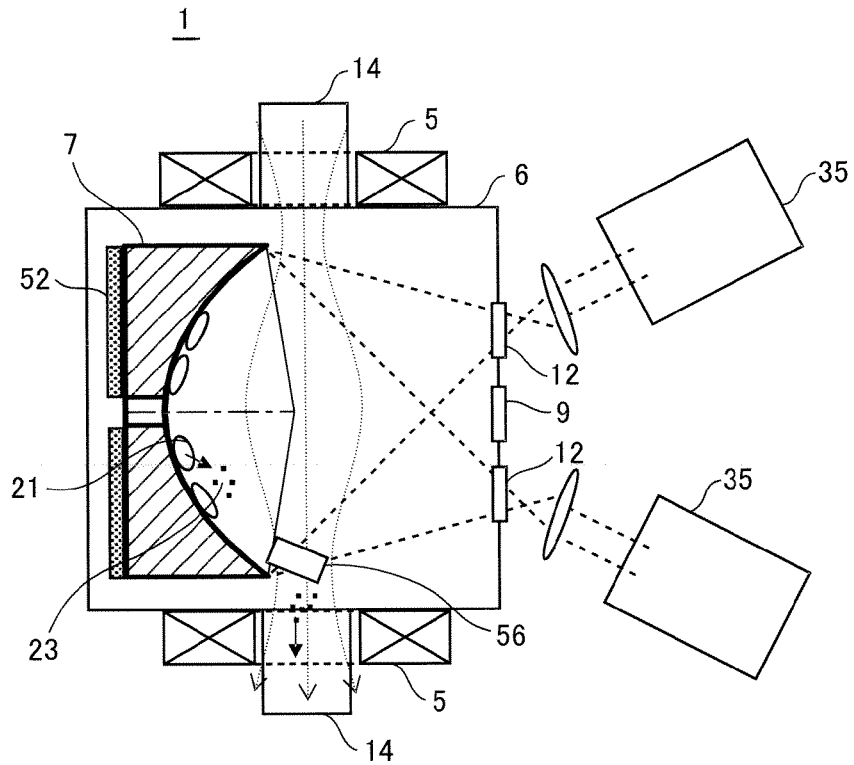
FIG. 13 is a sectional view illustrating a twelfth modification in which adhered debris is separated from an optical element and the separated debris is charged by an ionization laser.

FIG. 13 is a sectional view illustrating a twelfth modification in which the adhered debris is separated from the optical element and the separated debris is charged by an ionization laser beam.

In the EUV light source apparatus 1 according to the twelfth modification, ionization laser units 35 may be disposed outside the chamber 6. Laser beams from the ionization laser units 35 may be introduced into the chamber 6 through windows 12, which are separate from the exposure apparatus connection port 9, and the debris separated from the EUV collector mirror 7 maybe irradiated therewith. The laser beams from the ionization laser units 35 may preferably include wavelength components of one or more wavelengths tuned to the resonance absorption wavelength of the constituent atom of the debris. The debris may be charged by being irradiated with the laser beams. The configuration for separating the adhered debris 21 from the optical element, such as the EUV collector mirror 7, may be the same as that of the tenth modification. The EUV collector mirror 7 may be heated by the heater 52 in order to facilitate the separation of the adhered debris 21 from the optical element.

In the above configuration, in the EUV light source apparatus 1 according to the twelfth modification, the etchant gas may be introduced along the reflective surface of the EUV collector mirror 7 by the etchant gas port 56. With this, in the EUV light source apparatus 1 according to the twelfth modification, the Sn debris, for example, maybe separated from the EUV collector mirror 7 as a gasified substance ($SnH_4$, $SnBr_4$, or the like).

Here, the debris separated from the EUV collector mirror 7 maybe irradiated with the ionization laser beams from the ionization laser units 35, whereby the constituent atoms of the debris may undergo resonance absorption and be efficiently excited to a higher level. When the adhered debris is irradiated substantially simultaneously with laser beams tuned to the resonance absorption wavelengths of one or more wavelengths corresponding to energy required for the debris to transition between levels, the constituent atoms of the adhered debris may be excited sequentially between resonant levels, exceed the ionization level to be ionized, and become charged. In this way, the gasified debris may become charged, whereby the debris may be trapped in the magnetic field generated by the electromagnetic field generation unit 5 and collected into the charged debris collection unit 14.

Figure 14:
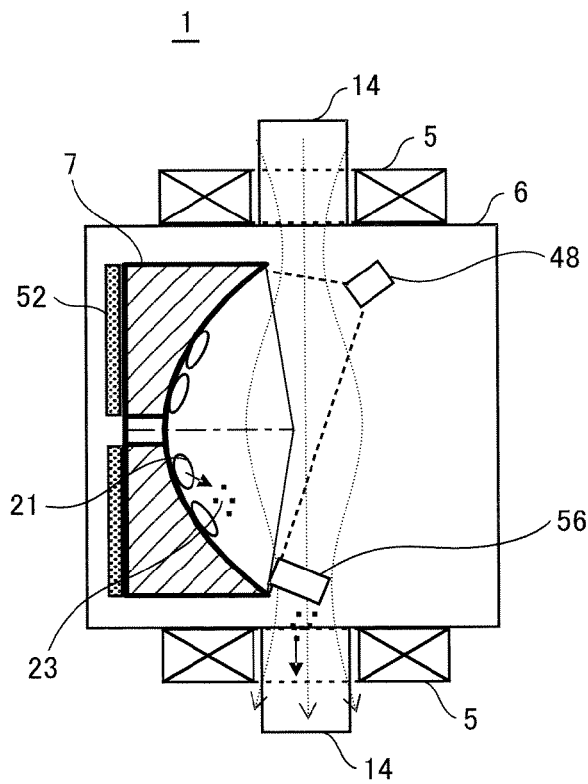
FIG. 14 is a sectional view illustrating a thirteenth modification in which adhered debris is separated from an optical element and the separated debris is charged by an x-ray.

FIG. 14 is a sectional view illustrating a thirteenth modification in which the adhered debris is separated from the optical element and the separated debris is charged by an x-ray.

In the EUV light source apparatus 1 according to the thirteenth modification, an x-ray generation unit 48 maybe disposed in the chamber 6. The x-ray generation unit 48 may be configured to irradiate the entire reflective surface of the EUV collector mirror 7 with an x-ray. The configuration for separating the adhered debris 21 from the optical element, such as the EUV collector mirror 7, may be the same as that of the tenth modification. The EUV collector mirror 7 may be heated by the heater 52 in order to facilitate the separation of the adhered debris 21 from the optical element.

In the above configuration, in the EUV light source apparatus 1 according to the thirteenth modification, the etchant gas may be introduced along the reflective surface of the EUV collector mirror 7 by the etchant gas port 56. With this, in the EUV light source apparatus 1 according to the thirteenth modification, the Sn debris, for example, may be separated from the EUV collector mirror 7 as a gasified substance ($SnH_4$, $SnBr_4$, or the like).

Here, the debris separated from the EUV collector mirror 7 may be irradiated with the x-ray from the x-ray generation unit 48, whereby the gasified substance containing the constituent atom of the debris may be dissociated to thereby be ionized. In this way, the gasified debris becomes charged, and thus the debris may be trapped in the magnetic field generated by the electromagnetic field generation unit 5 and collected into the charged debris collection unit 14.

Figure 15A:
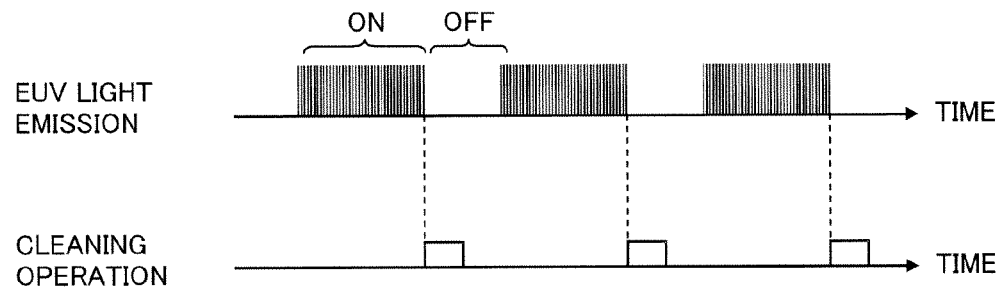
FIGS. 15A through 15C are timing charts showing the relationship between timing of EUV light emission and timing of cleaning.
Figure 15B:
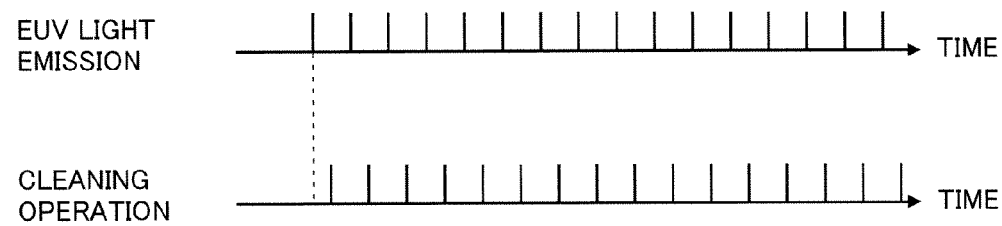
Figure 15C:
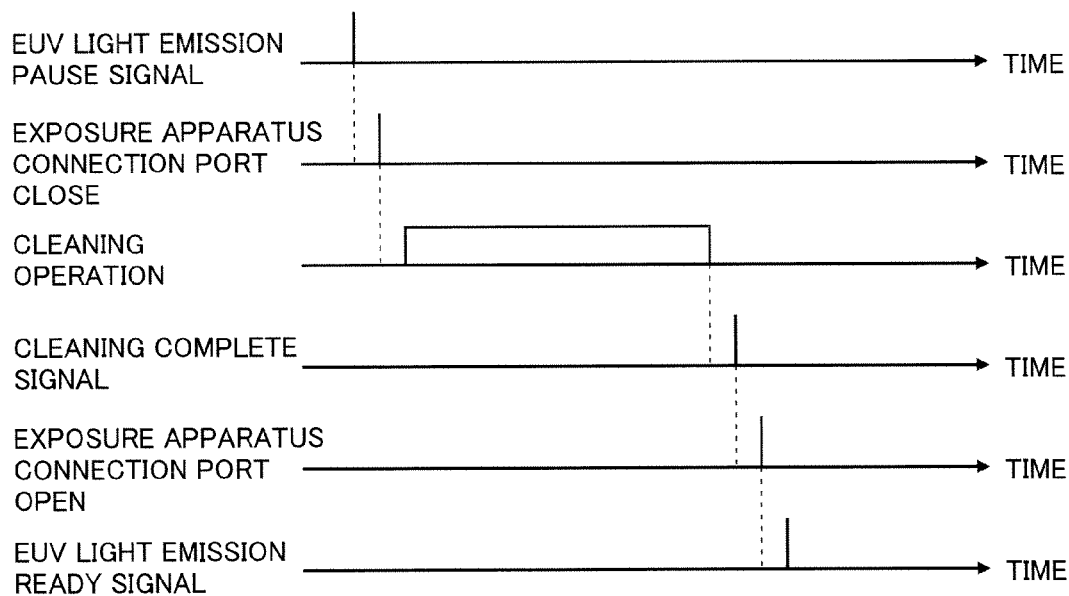

FIGS. 15A through 15C are timing charts illustrating the relationship between timing of EUV emission and timing of cleaning.

In the above-described fifth and sixth modifications, the EUV light emitted in the chamber may be used to cause the debris to become charged and to be separated from the optical element. Therefore, cleaning operation including causing the debris to become charged and to be separated from the optical element may be carried out simultaneously with the EUV light emission.

However, in the first through fourth and seventh through thirteenth modifications, the cleaning operation does not need to be carried out simultaneously with the EUV light emission; thus, the cleaning operation can be carried out at the following timing.

FIG. 15A shows an example in which the cleaning operation is carried out during an off-period of the burst-emitted EUV light in a burst oscillation pattern.

FIG. 15B shows an example in which the cleaning operation is carried out between pulses of the pulse-emitted EUV light.

FIG. 15C shows an example in which the cleaning operation is carried out when the EUV light emission is paused. The operation may be effective in a method in which the etchant gas is introduced into the chamber for cleaning, in a method in which the ion gas is flowed into the chamber for ionization, and so forth. When this operation is carried out, the following operation may preferably be carried out. First, when an EUV pause signal is received from an exposure apparatus serving as an output destination, the EUV light source apparatus 1 closes a gate valve inside the exposure apparatus connection port and cleans the interior of the chamber. When the cleaning is completed, a completion signal is outputted, and the gate valve inside the exposure apparatus connection port is opened. Thereafter, an EUV light emission ready signal is outputted to the exposure apparatus.

Figure 16:
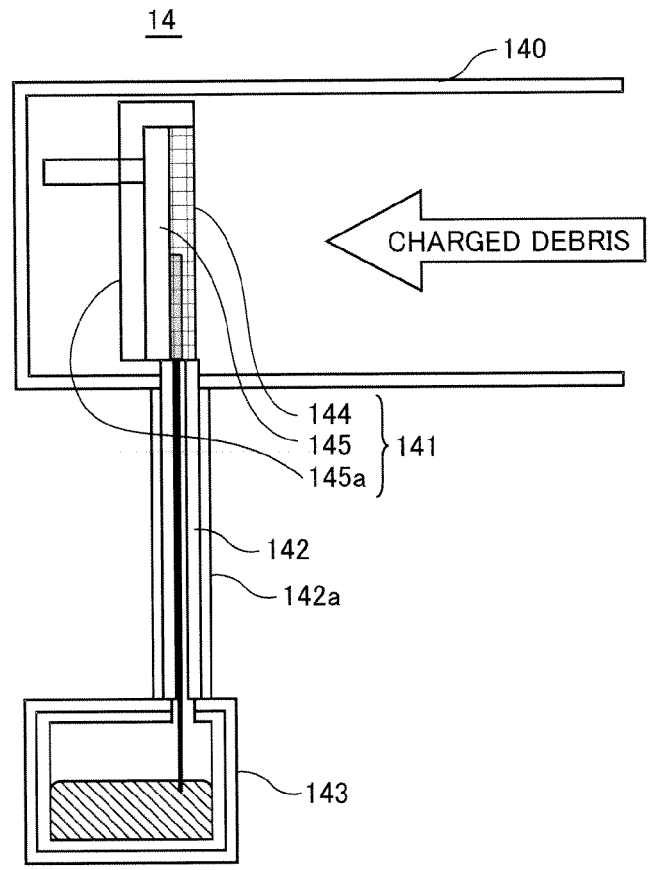
FIG. 16 is a sectional view illustrating a first configuration example pertaining to a charged debris collection unit.

FIG. 16 is a sectional view illustrating a first configuration example pertaining to the charged debris collection unit.

The charged debris collection unit 14 described in the modifications above may be configured as shown in FIG. 16. The charged debris collection unit 14 shown in FIG. 16 may preferably include a cylindrical unit 140, an ion collection unit 141, a discharge pipe 142, and a storage unit 143, in order to collect the charged debris including an ion of the target material and to discharge the debris outside the chamber.

The cylindrical unit 140 may be a cylindrical member with one end thereof opened toward the chamber and the other end thereof being closed. The cylindrical unit 140 is disposed substantially coaxially with the electric field or the magnetic field generated inside the chamber by the above-described electromagnetic field generation unit. The charged debris trapped in the electric field or the magnetic field inside the chamber may move in a direction substantially parallel to the electric field or the magnetic field, may be introduced into the cylindrical unit 140, and may move from the one end toward the other end of the cylindrical unit 140.

The ion collection unit 141 may be disposed at the other end of the cylindrical unit 140, and include an ion passing portion 144, an ion reception portion 145, and a temperature control mechanism 145a. The ion passing portion 144 may preferably be configured of porous or mesh-like material that is a highly resistant to sputtering by the charged debris. The ion reception portion 145 may preferably be formed of a material that is highly wettable with the target material.

The charged debris that has traveled from the one end to the other end of the cylindrical unit 140 may pass through the ion passing portion 144 and reach the ion reception portion 145. At this time, the charged debris may be captured in the ion reception portion 145, which is highly wettable with the target material. When the charged debris reaches the ion reception portion 145, the surface of the ion reception portion 145 maybe sputtered by the charged debris. However, the constituent particles of the sputtered ion reception portion 145 maybe captured in ion passing portion 144 to be prevented from entering the chamber.

The temperature control mechanism 145a may control the temperature of the ion reception portion 145 (for example, by heating) to a temperature exceeding the melting point of the target material. The debris molten in the ion reception portion 145 may flow toward the lower end of the ion reception portion 145 due to the gravitational force.

The discharge pipe 142 may connect the lower end of the ion collection unit 141 to the storage unit 143 provided outside the cylindrical unit 140. The discharge pipe 142 may preferably be provided with a temperature control mechanism 142a, as well, for controlling (for example, by heating) the discharge pipe 142 to a temperature exceeding the melting point of the target material. The target material molten in the ion reception portion 145 may flow in the discharge pipe 142 and further flow into the storage unit 143.

The storage unit 143 may preferably be detachable from the discharge pipe 142. In this case, the charged debris collection unit 14 may be readily maintained by replacing the storage unit 143.

Figure 17:
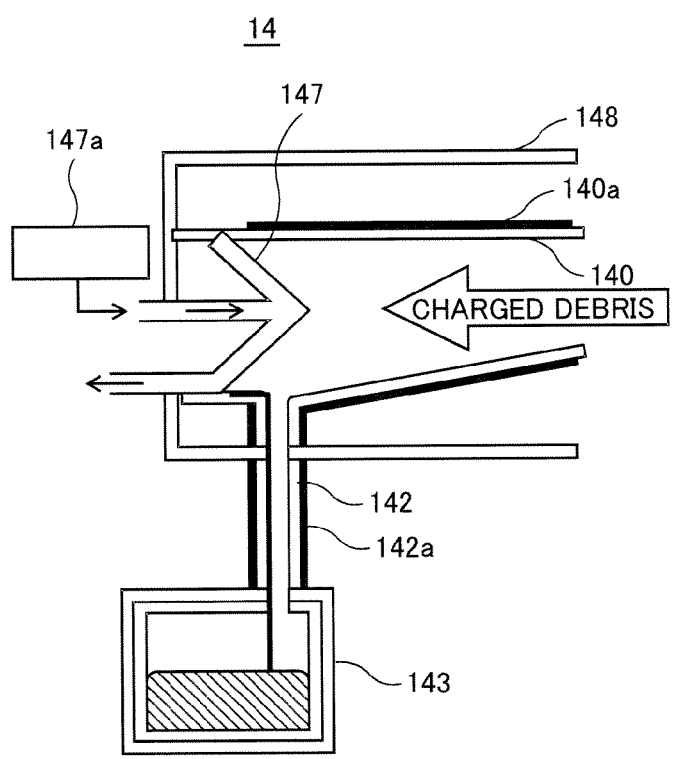
FIG. 17 is a sectional view illustrating a second configuration example pertaining to a charged debris collection unit.

FIG. 17 is a sectional view illustrating a second configuration example pertaining to the charged debris collection unit.

The charged debris collection unit 14 described in the modifications above is not limited to the first configuration example shown in FIG. 16, and may be configured as shown in FIG. 17. The charged debris collection unit 14 shown in FIG. 17 may preferably include an ion collection unit 147, and the cylindrical unit 140, the discharge pipe 142, and the storage unit 143 which are configured of substantially the same components to those shown in FIG. 16.

The ion collection unit 147 has a inclined surface inclined with respect to the axial direction of the cylindrical unit 140. The charged debris may be captured on the inclined surface of the ion collection unit 147. When the charged debris collides with the ion collection unit 147, the surface of the ion collection unit 147 may be sputtered by the charged debris. However, the constituent particles of the sputtered ion collection unit 147 may fly out in the direction of the normal line of the sputtered surface. Accordingly, the constituent particles of the sputtered ion collection unit 147 may not reach the one end of the cylindrical unit 140 opened toward the chamber, and fly to the wall surface of the cylindrical unit 140 to be deactivated and captured.

The ion collection unit 147 may preferably be configured of a material which is highly resistant to sputtering by the charged debris. Further, the ion collection unit 147 having the inclined surface may be formed in a conical shape, for example.

The ion collection unit 147 may preferably be provided with a temperature control mechanism 147a for controlling the temperature of the ion collection unit 147 so as to exceed the melting point of the target material. Since the charged debris that has traveled from the chamber directly collides with the ion collection unit 147, the ion collection unit 147 is easily overheated. Accordingly, as the temperature control mechanism 147a, a mechanism which mainly performs cooling may be used. As such temperature control mechanism 147a, a water cooling mechanism or a Peltier element may be used.

The wall surface of the cylindrical unit 140 may preferably be provided with a temperature control mechanism 140a, as well, for controlling (for example, by heating) the cylindrical unit 140 to a temperature exceeding the melting point of the target material. When the temperature control mechanism 140a is provided on the wall surface of the cylindrical unit 140, the cylindrical unit 140 may preferably be covered by an outer cylindrical unit 148.

The debris captured and molten in the ion collection unit 147 and on the wall surface of the cylindrical unit 140 may flow in the discharge pipe 142 due to the gravitational force, and further flow into the storage unit 143.

The above descriptions are merely illustrative and not limiting. Accordingly, it is apparent to those skilled in the art that modifications can be made to the embodiments of this disclosure without departing from the scope of this disclosure.

The terms used in this specification and the appended claims should be interpreted as "non-limiting." For example, the terms "include" and "be included" should be interpreted as "not limited to the stated elements." The term "have" should be interpreted as "not limited to the stated elements." Further, the modifier "one (a/an)" should be interpreted as "at least one" or "one or more."

What is claimed is:

1. An extreme ultraviolet light source apparatus in which a target material is irradiated with a laser beam and turned into plasma and extreme ultraviolet light is emitted from the plasma, the apparatus comprising:
    a chamber in which the extreme ultraviolet light is generated;
    a connection port through which the extreme ultraviolet light generated in the chamber is outputted, said connection port configured to be closed after starting of a pause in generating the extreme ultraviolet light and opened before ending of the pause; and
    a cleaning unit for separating debris adhered to an optical element inside the chamber, said cleaning unit separating the debris after said connection port is closed and before said connection port is opened.

2. The extreme ultraviolet light source apparatus according to claim 1, further comprising a generation unit for generating at least one of an electric field and a magnetic field inside the chamber.

3. A method for cleaning an optical element inside a chamber in which extreme ultraviolet light is generated to output the extreme ultraviolet light through a connection port to an external apparatus, comprising:
    receiving a pause signal from the external apparatus to stop generating the extreme ultraviolet light;
    closing said connection port after receiving the pause signal;
    cleaning the optical element after said connection port is closed;
    opening said connection port after cleaning the optical element; and
    output a ready signal to the external apparatus after said connection port is opened.

4. The extreme ultraviolet light source apparatus according to claim 2, further comprising a plasma generation laser unit for irradiating the target material with a laser beam.

5. The extreme ultraviolet light source apparatus according to claim 2, wherein the cleaning unit includes
    an adhered debris charging unit for charging the debris adhered to the optical element inside the chamber, and
    a charged debris separation unit for separating the charged debris from the optical element.

6. The extreme ultraviolet light source apparatus according to claim 5, wherein the adhered debris charging unit includes
    an electrode for causing electrostatic induction to the optical element inside the chamber to which the debris is adhered, and
    a power supply unit for applying constant voltage to the electrode.

7. The extreme ultraviolet light source apparatus according to claim 5, wherein the adhered debris charging unit includes a charged particle supply unit for supplying the optical element inside the chamber to which the debris is adhered with a charged particle.

8. The extreme ultraviolet light source apparatus according to claim 5, wherein the adhered debris charging unit includes a power supply unit for applying constant voltage to the optical element inside the chamber to which the debris is adhered.

9. The extreme ultraviolet light source apparatus according to claim 2, wherein the cleaning unit includes
    a cleaning light source unit for separating the debris adhered to the optical element inside the chamber from the optical element, and
    an ionization laser unit for charging the debris by irradiating the debris adhered to the optical element inside the chamber with a laser beam tuned to a resonance absorption wavelength of a constituent atom of the debris.

10. The extreme ultraviolet light source apparatus according to claim 2, wherein the cleaning unit includes an extreme ultraviolet light irradiation mirror for charging the debris and separating the debris from the optical element by irradiating the debris adhered to the optical element inside the chamber with the extreme ultraviolet light.

11. The extreme ultraviolet light source apparatus according to claim 2, wherein the cleaning unit includes
    an adhered debris separation unit for separating the debris adhered to the optical element inside the chamber from the optical element; and
    a separated debris charging unit for charging the debris separated from the optical element.

12. The extreme ultraviolet light source apparatus according to claim 11, wherein the separated debris charging unit includes a charged particle supply unit for supplying the debris separated from the optical element inside the chamber with a charged particle.

13. The extreme ultraviolet light source apparatus according to claim 2, wherein the cleaning unit includes an ionized etchant gas supply unit for supplying the debris adhered to the optical element inside the chamber with an ionized etchant gas to thereby separate the debris from the optical element and charge the debris.

14. The extreme ultraviolet light source apparatus according to claim 11, wherein the separated debris charging unit includes a plasma generation unit configured to generate plasma and supply the debris separated from the optical element inside the chamber with the plasma.

15. The extreme ultraviolet light source apparatus according to claim 11, wherein the separated debris charging unit includes at least one ionization laser unit for irradiating the debris separated from the optical element inside the chamber with a laser beam having a wavelength tuned to a resonance absorption wavelength of a constituent atom of the debris.

16. The extreme ultraviolet light source apparatus according to claim 11, wherein the separated debris charging unit includes an x-ray generation unit for irradiating the debris separated from the optical element inside the chamber with an x-ray.

* * * * *